(12) United States Patent
Burchak (10) Patent No.: US 10,636,584 B2
(45) Date of Patent: Apr. 28, 2020

(54) METHOD FOR MANUFACTURING A MATERIAL HAVING NANOELEMENTS

(71) Applicant: COMMISSARIAT A L'ENERGIE ATOMIQUE ET AUX ENERGIES ALTERNATIVES, Paris (FR)

(72) Inventor: Olga Burchak, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 40 days.

(21) Appl. No.: 15/564,833

(22) PCT Filed: Apr. 8, 2016

(86) PCT No.: PCT/EP2016/057850
§ 371 (c)(1),
(2) Date: Oct. 6, 2017

(87) PCT Pub. No.: WO2016/162540
PCT Pub. Date: Oct. 13, 2016

(65) Prior Publication Data
US 2018/0114650 A1    Apr. 26, 2018

(30) Foreign Application Priority Data

Apr. 10, 2015 (FR) ..................... 15 53108

(51) Int. Cl.
| | | |
|---|---|---|
| H01G 11/36 | (2013.01) | |
| H01M 4/134 | (2010.01) | |
| H01M 4/1395 | (2010.01) | |
| H01M 4/36 | (2006.01) | |
| H01M 4/38 | (2006.01) | |
| H01M 4/62 | (2006.01) | |
| C30B 29/06 | (2006.01) | |
| C30B 29/60 | (2006.01) | |
| H01G 11/24 | (2013.01) | |
| H01G 11/86 | (2013.01) | |
| C30B 7/10 | (2006.01) | |
| C30B 7/14 | (2006.01) | |
| C30B 29/08 | (2006.01) | |
| C01B 33/02 | (2006.01) | |
| H01M 10/052 | (2010.01) | |

(52) U.S. Cl.
CPC ............ *H01G 11/36* (2013.01); *C01B 33/02* (2013.01); *C30B 7/10* (2013.01); *C30B 7/14* (2013.01); *C30B 29/06* (2013.01); *C30B 29/08* (2013.01); *C30B 29/60* (2013.01); *H01G 11/24* (2013.01); *H01G 11/86* (2013.01); *H01M 4/134* (2013.01); *H01M 4/1395* (2013.01); *H01M 4/362* (2013.01); *H01M 4/38* (2013.01); *H01M 4/386* (2013.01); *H01M 4/625* (2013.01); *C01P 2004/16* (2013.01); *H01M 4/366* (2013.01); *H01M 10/052* (2013.01); *Y02E 60/13* (2013.01); *Y02T 10/7022* (2013.01)

(58) Field of Classification Search
None
See application file for complete search history.

(56) References Cited

U.S. PATENT DOCUMENTS

2010/0297502 A1    11/2010    Zhu et al.
2015/0086871 A1     3/2015    Cao et al.

FOREIGN PATENT DOCUMENTS

WO    2013/016339 A2    1/2013

OTHER PUBLICATIONS

Lu et al., "In situ growth of Si nanowires on graphene sheets for Li-ion storage", Electrochimica Acta, vol. 74, 2012, pp. 176-181; cited in the ISR.
Su et al., "Silicon-Based Nanomaterials for Lithium-Ion Batteries: A Review", Advanced Energy Materials, vol. 4, 2014, 23 pages; cited in the ISR.
Bogart et al., "Lithium Ion Battery Peformance of Silicon Nanowires with Carbon Skin", American Chemical Society NANO, vol. 8, 2014, No. 1 pp. 915-922 (published online Dec. 6, 2013); cited in the ISR and Specification.
Alper et al., "Semiconductor nanowires directly grown on graphene—towards wafer scale transferable nanowire arrays with improved electrical contact", Nanoscale, vol. 5, 2013, pp. 4114-4118 (published on Mar. 21, 2013); cited in the Specification.
Aradilla et al., "Novel hybrid micro-supercapacitor based on conducting polymer coated silicon nanowires for electrochemical energy storage", RSC Advances, vol. 4, 2014, pp. 26462-26467 (published on Jun. 4, 2014); cited in the Specification.

(Continued)

*Primary Examiner* — Sarah A. Slifka
(74) *Attorney, Agent, or Firm* — Seckel IP, PLLC (57) ABSTRACT

The process for manufacturing a product (1) including nanoelements (2) includes:
forming (E2) a mixture (6) including a plurality of electrically conductive grains (3), a catalyst (4) separate from the grains (3) of the electrically conductive grains, and a reactant (7) that is liquid or in the form of a suspension of solid particles in a liquid solvent and comprises a precursor of the material intended to form the nanoelements (2);
introducing the mixture (6) into a chamber of a reactor and pressurizing the reactor to a pressure less than or equal to 1 bar; and
obtaining (E3) the product (1) from the mixture (6) comprising a step (E3-1) of growing the nanoelements (2) from the catalyst (4), then combined with the grains (3) of the electrically conductive grains, the growth step (E3-1) being carried out by a step of heat treatment applied to the mixture (6).

17 Claims, 2 Drawing Sheets

(56) References Cited

OTHER PUBLICATIONS

Berton et al., "Wide-voltage-window silicon nanowire electrodes for micro-supercapacitors via electrochemical surface oxidation in ionic liquid electrolyte", Electrochemistry Communications, vol. 41, 2014, pp. 31-34; cited in the Specification.

Brust et al., "Synthesis of Thiol-derivatised Gold Nanoparticles in a Two-phase Liquid-Liquid System", J. Chem. Soc., Chem. Commun., 1994, pp. 801-802 (published on Jan. 1, 1994); cited in the Specification.

International Search Report and Written Opinion dated May 4, 2016 issued in corresponding application No. PCT/EP2016/057850; w/ English partial translation and partial machine translation (25 pages).

METHOD FOR MANUFACTURING A MATERIAL HAVING NANOELEMENTS

TECHNICAL FIELD OF THE INVENTION

The invention relates to the field of energy, and more particularly of energy storage elements.

One subject of the invention is, more particularly, a process for manufacturing a product comprising nanoelements.

PRIOR ART

Batteries or supercapacitors intended to store energy are dependent on the capacities of their electrodes.

According to one example, lithium-ion batteries constitute a choice energy source for a large number of applications ranging from electronic devices to electric vehicles. The technology of lithium-ion batteries is one of the most promising energy storage technologies owing to a high stored energy density and a long cycling lifetime. However, the rise of electric vehicles and large-scale energy storage applications require batteries of more advanced technology, offering a significantly higher energy density than that offered by the lithium-ion battery technology that is currently available.

To date, the most common lithium-ion battery technology is based on the use of an $LiCoO_2$ multilayer cathode and of a graphite anode, with theoretical limit capacities of 137 mAh/g for $LiCoO_2$ and 372 mAh/g for graphite. The anodes of lithium-ion batteries are formed of a layer of carbon powder, in the form of graphite, held by a binder. The carbon powder forms a conductive porous medium into which the electrolyte containing the lithium ions penetrates. During discharge, the lithium ions are intercalated in the carbon at a relatively low level.

In this sense, to improve the capacity of lithium-ion batteries, new anode materials must be developed.

Among the materials of possible interest for the anode of lithium-ion batteries, silicon has been the subject of great attention since it has the highest known theoretical storage capacity (4200 mAh/g for the intercalated phase $Li_{22}Si_5$, 3580 mAh/g for $Li_{15}Si_4$), and since it is an abundant material that is available everywhere. In theory, silicon anodes may increase the charge capacity of current lithium-ion batteries by more than 30%, and may enable a 10-fold increase in combination with next-generation cathode materials. The main limitation of silicon in a lithium-ion battery is the enormous change in volume that the material undergoes during cycling and which leads to the failure of the electrode. To fix this mechanical limitation, many studies have looked at the nanostructuring of silicon. Silicon at the nanometer scale in fact tolerates the volume changes induced by the intercalation of the lithium, and silicon nanowires are particularly interesting in this regard since they simultaneously provide short lithium diffusion distances owing to their small diameters (<100 nm), long continuous pathways for the transport of the current and a large contact interface with the electrolyte.

In this sense, the document "Lithium Ion Battery Performance of Silicon Nanowires with Carbon Skin" by Timothy D. Bogart et al. published in ACSNANO volume 8, no. 1 pages 915-922 in 2014 relates to the manufacture of nanowires in the form of a nanoscale powder of nanowires covered with carbon and intended for the formation of a lithium-ion battery anode. It was demonstrated by this document that the anodes formed from this powder were able to achieve a capacity of the order of 2000 mAh/g over 100 cycles. The major drawback that jeopardizes the industrial application of this method is the complexity of the SFLS (supercritical fluid-liquid-solid) process used for the formation of the powder, which is highly energy consuming and dangerous due to the high pressures involved (100 atm). Furthermore, this process does not enable the doping of the silicon nanowires in situ, the formation of a carbon "skin" on the nanowires was proposed to overcome this problem, but this step, carried out at high temperature, increases the overall energy cost of the synthesis of the powder.

Alternatively, for the manufacture of supercapacitor electrodes, the possibility of growing nanowires on a graphene matrix is known, as described in the document "Semiconductor nanowires directly grown on graphene-towards wafer scale transferable nanowire arrays with improved electrical contact" by John P. Alper et al. published in Nanoscale, 2013, 5, 4114-4118. However, this technique requires numerous steps, thus making industrialization expensive.

In this sense, there is a need to obtain nanowires, in particular intended to form a battery electrode, or supercapacitor electrode, for which the industrialization would be easier.

SUBJECT OF THE INVENTION

The objective of the present invention is to propose a solution which resolves the drawbacks listed above.

This objective is moved toward in particular by means of a process for manufacturing a product comprising nanoelements, said process comprising the following steps:
  forming a mixture comprising a plurality of electrically conductive grains, a catalyst separate from the grains of the plurality of electrically conductive grains, and a reactant that is liquid or in the form of a suspension of solid particles in a liquid solvent and comprises a precursor of the material intended to form the nanoelements,
  introducing the mixture into a reactor and pressurizing the reactor to a pressure less than or equal to 1 bar,
  obtaining the product from the mixture comprising a step of growing said nanoelements from the catalyst, then combined with said grains of the plurality of electrically conductive grains, said growth step being carried out by a step of heat treatment applied to said mixture.

In particular, the step of heat treatment applied to the mixture may be carried out at a temperature between 270° C. and 600° C., and preferentially between 270° C. and 450° C., under a non-oxidizing atmosphere.

The process may comprise, prior to the step of forming the mixture, a step of supplying the plurality of electrically conductive grains combined with the catalyst that is intended for the growth of the nanoelements.

In particular, the step of supplying the plurality of electrically conductive grains may be such that the catalyst comprises a plurality of catalyst elements, and at least one grain of the plurality of electrically conductive grains comprises a surface to which at least one of the catalyst elements of the plurality of catalyst elements is attached, advantageously 50% of the grains of the plurality of grains are adorned with at least one catalyst element.

In particular, the step of obtaining said product may comprise a step of forming an intermediate product comprising electrically conductive grains, from which said nanoelements extend, and a matrix at least partly covering the electrically conductive grains and said nanoelements.

In particular, the step of obtaining the product may comprise a step of removing the matrix from the intermediate product carried out by a step of washing the intermediate product.

The step of obtaining the product may comprise, after the step of removing the matrix, a step of depositing an electrically conductive layer on said nanoelements or a step of electrical doping of said nanoelements.

According to one embodiment, the step of obtaining the product comprises a step of heating the intermediate product that enables the formation, from the matrix, of an electrically conductive coating on said nanoelements. In particular, the step of heating the intermediate product is carried out by a step of additional heat treatment of said intermediate product at a temperature between 600° C. and 1500° C., preferably said temperature is between 900° C. and 1000° C.

Preferentially, the step of obtaining the product is such that, at the end of said obtaining step, said product obtained is in the form of a powder provided with electrically conductive grains from which the nanoelements extend.

According to one embodiment, the process comprises a step of producing the plurality of electrically conductive grains combined with the catalyst comprising the following steps:
  placing the grains of the plurality of grains and the catalyst in a solvent,
  drying, that makes it possible to evaporate the solvent which results in the combination of the catalyst with said grains of the plurality of electrically conductive grains.

The material intended to form the nanoelements may be chosen so that said material comprises silicon, germanium or an alloy of silicon with one of the materials chosen from: germanium, tin, nickel, copper or other transition metal, or an alloy of germanium with one of the materials chosen from: silicon, tin, nickel, copper or other transition metal.

In particular, the step of obtaining the product comprises a step of functionalizing the nanoelements comprising the deposition of a functional layer on said nanoelements.

The invention also relates to a process for manufacturing an electrode, comprising a step of forming said electrode from the product obtained from the manufacturing process as described.

The invention also relates to a powder comprising a plurality of electrically conductive grains, to which nanoelements are attached, the nanoelements have a maximum lateral dimension between 1 nm and 100 nm with a standard deviation distribution of less than or equal to 50% and a length ranging from 100 nm to 50 μm.

The invention also relates to an electrode for an energy storage element, said electrode comprising the powder as described, of which the grains of the plurality of electrically conductive grains are joined together by a binder.

The invention also relates to an energy storage element comprising an electrode, in particular an anode, formed by the electrode as described or an electrode obtained by the electrode manufacturing process as described, in particular said storage element is a lithium-ion battery.

BRIEF DESCRIPTION OF THE DRAWINGS

Other advantages and features will emerge more clearly from the description which follows of particular embodiments of the invention given by way of nonlimiting examples and represented in the appended drawings, in which.

DESCRIPTION OF PREFERRED EMBODIMENTS OF THE INVENTION

The process described below enables a facilitated manufacture of a product comprising nanoelements formed by a material suitable for the future use of said nanoelements, in particular a use for forming an electrode (in particular anode) of a supercapacitor, of a battery, or more generally of an energy storage element.

Although silicon is preferred for incorporating into the composition of the nanoelements, the present invention may also be applied to other materials. In particular, if the product is intended to form an electrode of an energy storage element, said other materials may be of the type capable of intercalating an electrolyte of said energy storage element, in particular a lithium-ion electrolyte. Examples will be described in detail subsequently.

In the present description, a nanoelement is advantageously in the form of an elongated element such as a wire. In the field, the nanoelement may be considered to be a nanowire. Thus, the term nanoelement(s) used in the present description may be replaced by nanowire(s), or vice versa. Typically, the dimensions of a nanoelement or nanowire may be between 100 nm and 50 μm for its length and between 1 nm and 100 nm for its lateral dimensions, preferentially with a ratio of the length to the width of greater than or equal to 10.

Figure 1:
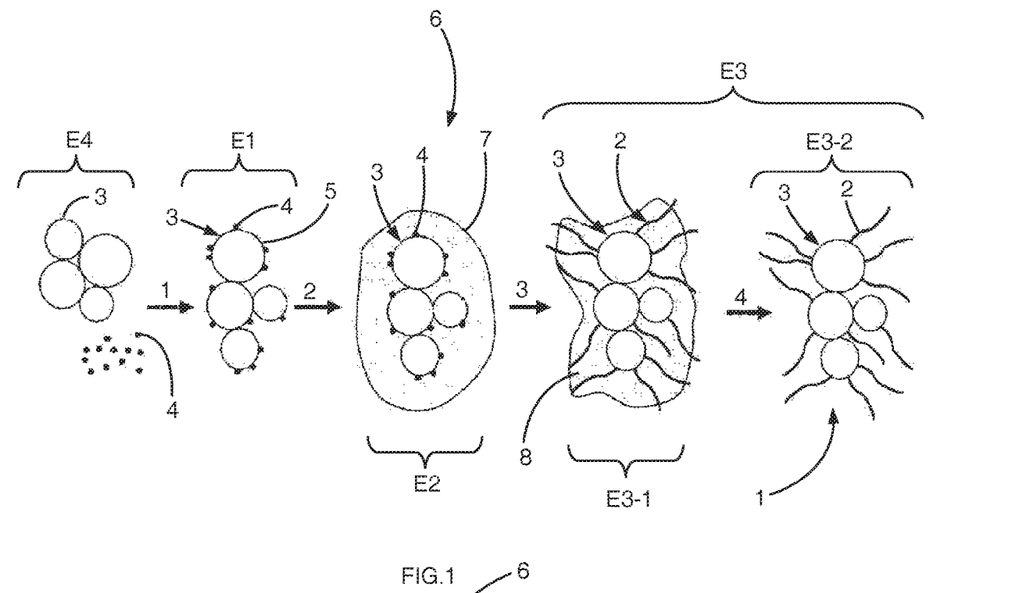
FIG. 1 illustrates various steps of a process for manufacturing a product comprising nanoelements according to one particular method of implementation of the invention.
Figure 2:
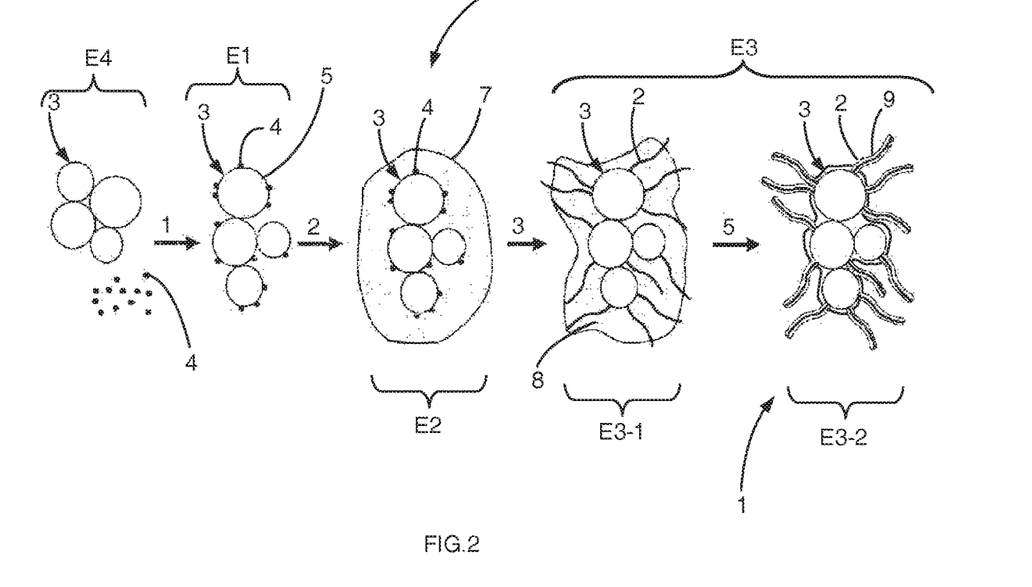
FIG. 2 illustrates various steps of a process for manufacturing a product comprising nanoelements according to another particular method of implementation of the invention.

FIGS. 1 and 2 illustrate a process for manufacturing a product 1 comprising nanoelements 2.

According to one particular implementation, the process may comprise a step E1 of supplying a plurality of electrically conductive grains 3 combined with a catalyst 4 that is intended for the growth of the nanoelements 2.

Preferably, the plurality of electrically conductive grains 3 combined with the catalyst 4 is in the form of a powder when it is supplied (step E1).

In particular, the expression "the plurality of electrically conductive grains 3 combined with the catalyst 4" is understood to mean that the catalyst 4 is attached to the surface of at least some of the grains of the plurality of grains. That is to say that the catalyst 4 is distinct from the grains 3 but joined to at least some of the latter. The term "joined to" is understood here to mean "attached to", for example by chemical affinity.

The catalyst 4 makes it possible to form sites for growth of the nanoelements.

In particular, the step E1 of supplying the plurality of electrically conductive grains 3 combined with the catalyst 4 is such that the catalyst 4 comprises a plurality of catalyst elements 4, and at least one (preferably several or each) grain 3 of the plurality of electrically conductive grains comprises a surface 5 to which at least one of the catalyst elements 4 of the plurality of catalyst elements 4 is attached. In particular, all or some of the grains 3 of the plurality of electrically conductive grains may comprise on its surface 5

(referred to as outer surface) several distinct catalyst elements 4. In other words, the catalyst elements 4 sporadically adorn grains 3 of the plurality of electrically conductive grains in order to form sites for growth of the nanowires 2. In this sense, it is understood that the supply step E1 is configured so that all or some of the grains 3 of the plurality of electrically conductive grains comprise preferential zones for growth of the nanoelements 2 formed by catalyst elements 4 positioned at the surface 5 of all or some of the grains 3 of the plurality of electrically conductive grains.

Advantageously, 50% of the grains of the plurality of grains are adorned with at least one catalyst element.

In other words, when the catalyst is combined with said grains, either each grain is attached to at least one catalyst element (ideal case), or some of the grains are devoid of catalyst elements (case that will be encountered most often).

In fact, when forming grains to which catalyst elements are attached, use is made of blank grains that are mixed with the catalyst, the probabilities of hybridization are therefore such that in most cases catalyst elements attach themselves to some grains (at least one grain) while leaving other grains devoid of any catalyst element. Afterwards, it is difficult to sort the blank grains from those that are not blank. Thus, after obtaining the product described below, the grains where at least one catalyst element was attached to the surface before the growth step are attached to at least one corresponding nanoelement, and some grains without nanoelements will remain.

Mention was made above of a particular implementation in that, when the plurality of electrically conductive grains 3 is supplied, it is not necessarily already combined with the catalyst 4. That is to say that, according to one embodiment, the catalyst 4 is not directly joined to the grains 3 when it is supplied.

In other words, more generally, the manufacturing process comprises a step E2 of forming a mixture 6 comprising the plurality of electrically conductive grains 3, the catalyst 4 distinct from said grains 3 of the plurality of electrically conductive grains (distinct in that the catalyst 4 and the grains 3 are combined or separate different entities), and a reactant 7 comprising a precursor of the material intended to form the nanoelements 2. Preferably, the reactant is a liquid or is in suspension (of solid particles) in a liquid, in particular liquid under normal temperature and pressure conditions. Thus, the mixture 6 is easy to handle and the industrialization of the manufacturing process is simplified.

Advantageously, in order to facilitate the handling, the total mixture 6 is a liquid suspension containing at least the grains, the catalyst and the precursor.

It is understood that when the mixture 6 is formed, the catalyst 4 may be, depending on the embodiment, joined, or not, to all or some of said grains 3 of the plurality of electrically conductive grains. More particularly, when step E1 is carried out, the manufacturing process comprises said step E1 carried out before the forming step E2.

In the present description, use is also made of the terms "intercalating material" to refer to the material intended to form the nanoelements 2. This is valid in particular when the product obtained is intended to be used to form an electrode configured to intercalate the ions of an electrolyte of an energy storage element.

Although the catalyst 4 is combined (combining carried out before step E2) or intended to be combined (combining carried out during step E2) with the grains 3 of the plurality of electrically conductive grains, it is considered to be distinct from said grains 3 in that it forms a different entity, in particular formed by a material different from that forming said grains 3.

The grains 3 of the plurality of electrically conductive grains may be formed by a carbon-based material, an electrically conductive organic compound, an electrically conductive organometallic compound, or an electrically conductive inorganic material such as a ceramic. The carbon-based material may be a one-dimensional, two-dimensional or three-dimensional form of carbon of nanometer or micrometer size: particles, fibers, sheets, porous solids, etc. Preferentially, the grains 3 are formed of carbon black, graphite, carbon nanotubes, carbon fibers, graphene, carbon foams or porous carbon of controlled texture, or a mixture of these various forms of carbon.

It is then understood that the definition of the term grain 3 in the present description should be taken in its broad sense. Thus, a grain 3 may be in the form of a body that is spherical, elongated or structured according to a desired shape. When the plurality of grains 3 is in a dry state, it then forms an electrically conductive powder.

The catalyst 4 may also be chosen from nanoparticles of a metal, of a bimetallic compound, of a metal oxide, or of a metal nitride. The nanoparticles of a metal are in particular gold, cobalt, nickel, bismuth, tin, iron, indium, aluminum, manganese or iridium particles. The nanoparticles of a bimetallic compound are in particular $MnPt_3$ or FePt nanoparticles. The nanoparticles of a metal oxide are in particular ferric oxide nanoparticles. The nanoparticles then form the catalyst elements 4 targeted in the present description. The materials targeted in the present paragraph are all compatible with a growth of silicon nanowires.

Preferentially, the catalyst 4 is formed of gold nanoparticles. The gold nanoparticles used in the process according to the invention may be synthesized according to a process known from the article "Synthesis of Thiol-derivatised Gold Nanoparticles in a Two-phase Liquid-Liquid System" by Brust et al., published in J. CHEM. SOC., CHEM. COMMUN., 1994, pages 801 and 802.

Generally, the diameter of the catalyst elements (or catalyst nanoparticles in the example) may be between 1 nm and 100 nm. The notion of diameter is valid if the catalyst elements 4 adopt the shape of a sphere, if not it is considered that the largest dimension of the catalyst elements 4 may be between 1 nm and 100 nm.

The material intended to form the nanoelements 2 (and therefore its precursor) may be chosen so that said material comprises silicon, germanium or an alloy of silicon with one of the materials chosen from: germanium, tin, nickel, copper or other transition metal, or an alloy of germanium with one of the materials chosen from: silicon, tin, nickel, copper or other transition metal. A person skilled in the art will therefore be able to choose the precursor suitable for obtaining nanoelements in the material targeted in the present paragraph. Furthermore, in the list given above of the material intended to form the nanoelements, the compatible catalysts for the complete list are gold, nickel, iron and also oxides thereof or nitrides thereof, for silicon all the catalysts targeted above may also be used.

For example, for the silicon material, the precursor could be one or more organic silane(s), for example diphenylsilane, monophenylsilane, triphenylsilane which have the advantage of being stable in air, or another organic silane. The reactant 7 may also contain a source of dopant of the intercalating material, for example diphenylphosphine or triphenylborane, which supply P or B atoms for doping the silicon. The reactant 7 may optionally contain a solvent.

The manufacturing process also comprises a step of introducing the mixture 6 into a chamber of a reactor and of pressurizing the reactor to a pressure less than or equal to 1 bar (absolute pressure). The reactor is then sealed. Thus, the pressure in the reactor is less than or substantially equal to the atmospheric pressure when the reactor is sealed.

Finally, generally, the manufacturing process comprises a step E3 of obtaining the product 1 from the mixture 6, said obtaining step E3 comprising a step E3-1 of growing said nanoelements 2 from the catalyst 4, then combined with said grains 3 of the plurality of electrically conductive grains. Said growth step E3-1 being carried out by a step of heat treatment applied to said mixture 6. In particular, the growth step E3-1 is such that, at its end, the nanoelements 2 extend from grains 3 of the plurality of electrically conductive grains and are formed by said material.

Preferentially, the step E3 of obtaining the product 1 is such that, at the end of said obtaining step E3, said product 1 obtained is in the form of a powder provided with electrically conductive grains 3 from which the nanoelements 2 extend. As mentioned above, the powder may also comprise, where appropriate, grains derived from the plurality of grains that are devoid of any nanoelements. In particular, several nanoelements 2 extend from each grain 3 of the plurality of electrically conductive grains.

In particular, just before the growth step is carried out, the catalyst 4 comprising a plurality of catalyst elements 4, at least one (preferably several or each) grain 3 of the plurality of electrically conductive grains comprises a surface 5 on which at least one of the catalyst elements of the plurality of catalyst elements 4 is formed. Advantageously, 50% of the grains bear at least one catalyst element. In particular, all or some of the grains 3 of the plurality of grains may comprise on its surface 5 (referred to as outer surface) several distinct catalyst elements 4. In other words, the catalyst elements 4 sporadically adorn the grains 3 of the plurality of electrically conductive grains.

According to one particular embodiment, the step of heat treatment (enabling the growth—coinciding with step E3-1 from FIGS. 1 and 2) applied to the mixture 6 is carried out at a temperature between 270° C. and 600° C., and preferentially between 270° C. and 450° C., under a non-oxidizing atmosphere. This heat treatment step may be carried out by means of the use of the chamber of the reactor in which the mixture 6 is placed, said chamber being placed at the abovementioned temperature. Thus, the heat treatment proposed by the present invention makes it possible to obtain a product 1 more easily than within the context of the prior art where the techniques needed are more complex to control. During step E3, the pressure in the reactor may increase due to the heat treatment. For example, the pressure may rise to 10 bar. Preferably, this pressure depends on the temperature of the heat treatment and is not monitored or controlled. Preferably, the product is obtained at a pressure greater than 1 bar.

In particular, a "non-oxidizing atmosphere" is understood in the present description to mean in the absence of air, for example under an argon, nitrogen or hydrogen atmosphere, for example at ambient pressure or under medium or high vacuum in order to limit the presence of oxygen.

Preferably, the step of introducing the mixture 6 into a chamber of a reactor and of pressurizing the reactor to a pressure less than or equal to 1 bar is an intermediate step between steps E2 and E3.

According to one embodiment, the process for manufacturing the nanoelements 2 comprises a step E4 of producing the plurality of electrically conductive grains 3 combined with the catalyst 4 comprising a step of placing the grains 3 of the plurality of grains and the catalyst 4 in a solvent, and a step of drying, which makes it possible to evaporate the solvent which results in the combination of the catalyst 4 with said grains 3 of the plurality of electrically conductive grains, i.e. that which is supplied in step E1. It is then understood that this production step E4 is carried out prior to step E1. Alternatively, the step of producing the plurality of electrically conductive grains 3 combined with the catalyst 4 may be carried out during step E2.

In particular, the step E4 of producing the plurality of electrically conductive grains 3 combined with the catalyst 4 consists in bringing the catalyst 4 into contact with the grains 3 of the plurality of electrically conductive grains at ambient atmosphere in a suitable solvent according to the catalyst 4. In other words, once the grains 3 of the plurality of electrically conductive grains and the catalyst 4 are in the solvent, the catalyst 4 will be deposited, in particular in the form of islands at the surface of at least some of said grains 3. After the catalyst 4 has been brought into contact with said grains 3 of the plurality of electrically conductive grains, the solvent is removed, for example in a rotary evaporator, or by centrifugation and elimination of the solvent so as to obtain a powder containing the grains 3 of the plurality of electrically conductive grains combined with the catalyst 4. In particular, the weight ratio of catalyst 4 to grains 3 of the plurality of electrically conductive grains is preferentially between one to one million and one to ten, this being applicable in particular to all the embodiments of the invention.

According to one example, the solvent may be water, chloroform or an aliphatic oil such as hexane, then it will be dried in air or under vacuum so that the catalyst is deposited in a suitable manner on the grains 3 of the plurality of electrically conductive grains.

According to one embodiment, the surface of the catalyst 4 may be covered with a ligand such as dodecanethiol. The ligand prevents the catalyst particles from agglomerating. Furthermore, since the ligand has a high chemical affinity with carbon, it improves the attachment to the grains. The ligand-covered catalyst nanoparticles, then forming the catalyst elements 4, may be dispersed in a solvent such as toluene, in particular at a concentration of 50 mg/mL, in order to form a stock solution of catalyst nanoparticles to be mixed with the grains 3 of the plurality of electrically conductive grains.

According to one embodiment, the step E2 of forming the mixture may consist of bringing the grains 3 of the plurality of electrically conductive grains (in particular that are in the form of electrically conductive powder) combined (or not yet combined) with the catalyst 4 into contact with the reactant 7. As specified above, the reactant 7 contains at least the precursor of the material intended to form the nanoelements 2. The reactant 7 may be in the form of a liquid or a powder in suspension in a liquid. When the reactant 7 is in the form of a powder, the grains 3 of the plurality of electrically conductive grains are combined with said catalyst 4 and the reactant 7 is finely mixed with said grains 3. For example, use may be made of a solid source of silicon, for example triphenylsilane, in a liquid solvent, for example squalane.

According to one embodiment mentioned above, the reactant 7 may also contain a source of dopants of the material intended to form the nanoelements in order to modify its electrical characteristics, for example if it is desired for the latter to be electrically conductive and naturally doped during the growth thereof. The reactant may also comprise a solvent, such a solvent makes it possible to improve the intermixing of the grains and of the precursor elements, it may also be chosen in order to be a source of material that will constitute the matrix 8 then subsequently the layer 9.

If it is desired for the nanoelements 2 to be doped during their growth, the source of dopant may be chosen in a manner known from the prior art for the material intended to form the nanoelements. In the case of silicon, the source of dopant may be chosen from organophosphines, such as diphenylphosphine; organoboranes such as triphenylborane, diphenylboric anhydride; organoarsines; aromatic amines, such as diphenylamine, or triphenylamine.

Generally, in the case of the desired electrical doping of the nanoelements, the proportion of dopant source relative to the precursor of the material intended to form the nanoelements 2 in the reactant 7 is between one to one million and one to five in moles. It is preferentially from 0.001 to 1% in moles.

Preferentially, the reactant 7 is mixed with the electrically conductive powder (the grains 3 of the plurality of electrically conductive grains) containing the catalyst 4 in a weight proportion of from 10% to 500%. Preferably, the reactant 7 is liquid under the normal temperature and pressure conditions.

According to one implementation, the precursor of the material intended to form the nanoelements 2 comprises one or more organic or organometallic compounds containing the element(s) chosen for said material. Preferably, the organic or organometallic compound(s) are liquid under normal temperature and pressure conditions. In the case of silicon, the source of silicon may be one (or more) silane compound or a mixture of silane compounds. The silane compound is especially an organosilane, in particular an organomonosilane, an organodisilane or an organotrisilane, or a simple silane of formula $Si_nH_{(2n+1)}$ with n ranging from 1 to 10. The organosilane may in particular be a mono-, di- or triarylsilane such as monophenylsilane, diphenylsilane, triphenylsilane, or a mono-, di- or tri-alkylsilane such as octylsilane.

According to one particular embodiment, the step E3 of obtaining said product comprises a step of forming an intermediate product comprising electrically conductive grains 3, derived from the plurality of electrically conductive grains, from which said nanoelements extend, and a matrix 8 at least partly covering said electrically conductive grains 3 and said nanoelements 2. Preferably, the matrix 8 completely covers said grains 3 and said nanoelements 2.

In particular, the intermediate product as described is obtained after applying the heat treatment step E3-1. The matrix 8 is therefore formed by the residues of the reactant 7.

According to an example, the step E3-1 of heat treatment of the mixture 6 formed is such that said mixture 6 formed is placed in a sealed reactor under vacuum or under a non-oxidizing atmosphere and at a temperature between 270° C. and 600° C., preferentially between 270° C. and 450° C. The duration of the treatment is from 1 minute to 1 day, preferentially 1 hour. In this temperature range, the precursor of the material intended to form the nanoelements 2 undergoes a pyrolysis, that is to say a thermal decomposition that leads to the formation of pyrolysis vapors which in contact with the catalyst 4 lead to the growth of the nanoelements 2 on the grains 3 of the plurality of electrically conductive grains and to the deposition of the matrix 8.

Returning to the particular embodiment, in a first case illustrated in FIG. 1, the step E3 of obtaining the product may comprise a step E3-2 of removing the matrix 8 from the intermediate product carried out by a step of washing the intermediate product.

The washing step makes it possible to eliminate the matrix 8, in order to release the nanoelements 2, optionally doped during their growth, extending from the grains 3 of the plurality of electrically conductive grains. Washing according to the common practices of a person skilled in the art, depending on the type of matrix 8, makes it possible to carry out this step. For example, in the case of an organic matrix 8, washing with nonpolar organic solvents, pure or as a mixture, in particular hexane or toluene, is carried out. Otherwise, in the case of an inorganic matrix, an acid or basic washing suitable for the type of matrix is carried out.

In the first case, if the nanoelements 2, after the step of removing the matrix 8, are not electrically conductive (for example doped during their growth), it is then possible to carry out an electrical doping of the latter. For example, the step E3 of obtaining the product 1 comprises, after the step of removing the matrix 8, a step of depositing an electrically conductive layer in particular on said nanoelements 2 or a step of electrical doping of said nanoelements 2 after their formation followed by an annealing.

Returning to the particular embodiment, in a second case illustrated in FIG. 2, the obtaining step E3 may comprise a step of depositing an electrically conductive layer 9 on the nanoelements 2 carried out by a heat treatment of the matrix 8. In other words, the step E3 of obtaining the product 1 may comprise a step of heating the intermediate product that enables the formation, from the matrix 8, of an electrically conductive coating 9 on said nanoelements 2 (FIG. 2). For example, this heating step may consist of a heat treatment in order to transform, by annealing, the organic matrix 8 into a conductive coating on the surface of the previously synthesized nanoelements 2. The annealing treatment is in particular carried out at a temperature between 600° C. and 1500° C., preferentially between 900° C. and 1000° C. In this temperature range, the organic matrix 8 undergoes a thermal decomposition leading to the formation of a graphitic layer that coats the nanoelements 2 and the grains 3 of the plurality of electrically conductive grains.

For example, the step of heating the intermediate product is carried out by a step of additional heat treatment of said intermediate product at a temperature between 600° C. and 1500° C., preferably said temperature is between 900° C. and 1000° C.

This second case, illustrated in FIG. 2, enables the growth of the nanowires 2 (in particular of intercalating material) to be followed in "one-pot" by the synthesis of the conductive coating 9 on the nanowires 2. The conductive coating 9 increases the overall conductivity of the product 1 obtained. In the case of silicon nanowires 2 covered with a carbon coating 9, it has been shown in the prior art that the carbon coating 9 limits the formation of the SEI (solid electrolyte interface) passivation layer, and therefore the capacity loss in a lithium-ion battery in the first cycles.

Figure 3:
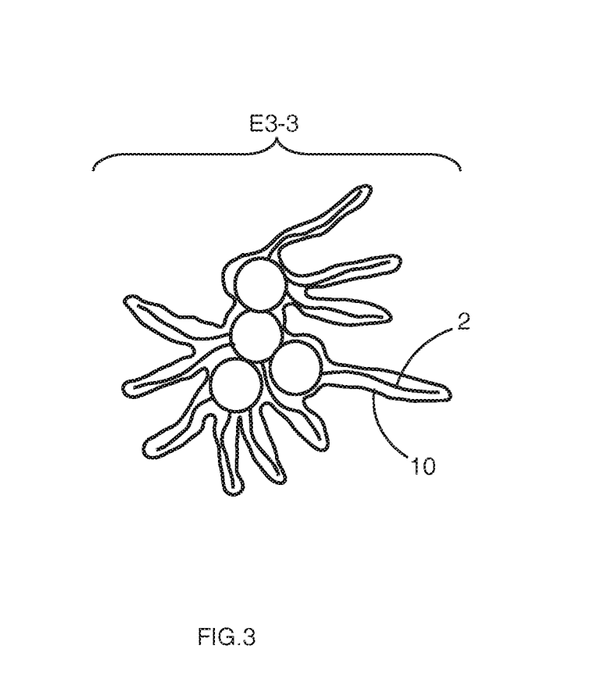
FIGS. 3 and 4 illustrate an additional step carried out in order to form a deposit of a functional layer, in particular respectively carried out after the various steps from FIGS. 1 and 2.
Figure 4:
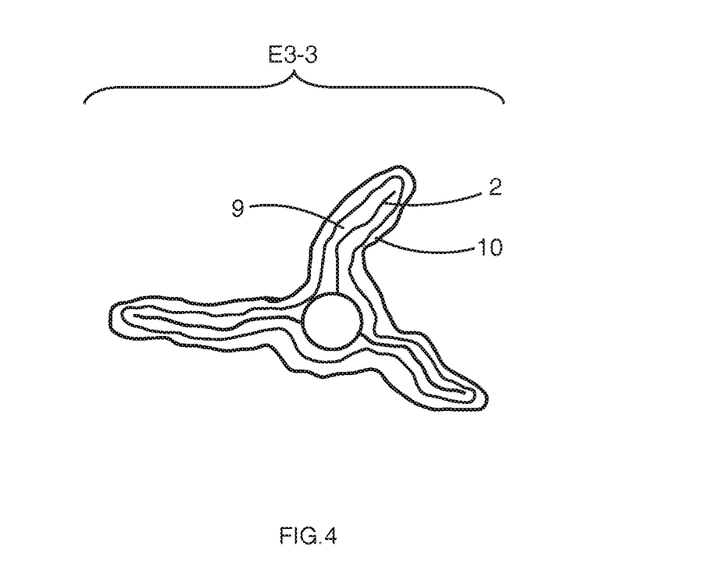

According to one method of implementation applicable to the various embodiments, the step E3 of obtaining the product 1 comprises a step E3-3 (FIGS. 3 and 4) of functionalizing the nanoelements 2 comprising the deposition of a functional layer 10 on the nanoelements 2. FIG. 3 illustrates the step E3-3 applied following FIG. 1 in particular after step E3-2, and FIG. 4 illustrates the step E3-3 applied following FIG. 2 in particular after step E3-2. The functional layer 10 may be organic or inorganic. For example, this functional layer 10 may be a passivation layer against the electrochemical attack of the intercalating material, or an active redox layer for charge storage at the surface of the electrode obtained from the product 1.

In particular, this functional layer 10 is deposited so as to completely or partly surround the nanoelements 2 with or without interposition of intermediate material. It is then understood that, depending on the method of implementation of the invention, the functional layer 10 may:

- be directly deposited at the outer surface of the nanoelements (method seen in FIGS. 1 and 3 where the nanoelements 2 are bare),
- be directly deposited at the outer surface of the electrically conductive layer (method seen in FIGS. 2 and 4 where the nanoelements 2 are covered by the electrically conductive layer 9).

Preferably, this functional layer 10 may be a silicon oxide layer or a polymer layer or a diamond layer.

When the functional layer 10 is a silicon oxide layer, the nanoelements 2 are preferentially silicon nanowires. In particular, the silicon oxide layer may be obtained according to the process described by the document "Wide-voltage-window silicon nanowire electrodes for micro-supercapacitors via electrochemical surface oxidation in ionic liquid electrolyte" by N. Berton et al., published in Electrochemistry Communication, 41 (2014) 31-34. The advantage of the silicon oxide layer is to increase the specific capacity when the product 1 obtained is used as anode of an energy storage element such as a capacitor.

When the functional layer is a polymer layer, the nanoelements are preferentially silicon nanowires. In particular, the polymer layer may be obtained according to the electrochemical process described in the document "Novel hybrid micro-supercapacitor based on conducting polymer coated silicon nanowires for electrochemical energy storage" by D. Aradilla et al., published in RSC Advances 2014, 4, 26462-26467. Such a polymer coating makes it possible to improve the energy densities and power densities of micro-supercapacitors.

When the functional layer is a diamond layer, this makes it possible to protect the electrode against an electrochemical attack even under high voltage, and thus to obtain high-power capacitors.

The process for manufacturing the product described in the present description in particular allows a "one-pot" synthesis by mixing all the necessary ingredients (conductive powder 3, source of intercalating material, catalyst 4) in order to obtain a base product that is homogeneous, easy to handle, harmless, stable in air and ready to use (for example in order to form an electrode). Simple heating (heat treatment) of this mass mixed in a sealed reactor under vacuum or under a non-oxidizing atmosphere makes it possible to obtain a conductive interconnected network of nanowires of intercalating material attached to the conductive powder (in this case the nanoelements/nanowires are connected in particular electrically to one another). The mixing of the catalyst-covered powder with the reactant enables a reaction for growth of the nanowires that is homogeneous throughout the volume of conductive powder. Due to the simplicity of implementation and the robustness of the reactive mixture, this preparation method is easily scaled up by a person skilled in the art.

In other words, the step of obtaining the product 1 may be carried out by a one-pot synthesis of the reactant 7 placed in the presence of the grains 3 of the plurality of electrically conductive grains and the catalyst 4. This being valid in particular for the embodiment from FIG. 2.

Moreover, the process for manufacturing the product described above enables a high yield of greater than 30% relative to the amount of intercalating material introduced. This enables the production of the product of the invention in a large quantity in a reduced synthesis space. The synthesis proposed is not very expensive because it uses cheap reactants that are stable in air and operating conditions that are not very energy-consuming, and because the synthesis yield is close to 100%. The industrialization is therefore facilitated compared to the other product syntheses containing silicon and carbon nanowires from the prior art. This product in the form of black powder is ready to use, for example as anode material of a lithium battery, as a direct replacement for graphite in the production line for producing battery anodes.

The possibility of doping the nanowires of intercalating material makes it possible to increase their conductivity. The conductivity of the product containing nanowires on conductive powder will be improved thereby.

Moreover, the process of manufacturing the product is not very energy-consuming. All the preparation steps of the product, with the exception of the heat treatment step, may be carried out at ambient atmosphere and at ambient temperature, thus avoiding the use of complex and energy-consuming equipment such as glove boxes or vacuum chambers. The heat treatment step is furthermore not very demanding on the one hand regarding the quality of the atmosphere (non-oxidizing atmosphere, under vacuum or pressure close to ambient), on the other hand it consumes little heating power: the temperature is not very high, the heating time is short.

According to the process for manufacturing the product described above, it is possible for the product obtained to be in the form of a powder, in which the size of the grains is at least equal to the size of the grains of the initial conductive powder (the one corresponding to the plurality of grains before growth of the nanowires). The product obtained may thus benefit from the performances of the nanowires of intercalating material, which are usually obtained as a powder of nanometer size, whereas the powder is in fact of micrometer size. This difference in grain size enables an easier management of production safety by reducing the risk linked to the dissemination of nanopowders.

Particular embodiment examples are given below.

A first example consists in synthesizing a batch of a composite of non-doped silicon nanowires and carbon black with solvent washing. In a first step, gold nanoparticles are synthesized according to the process described in the article by Brust et al. mentioned above. Their diameter is from 1 nm to 4 nm, and their surface is covered with dodecanethiol. These nanoparticles are then dispersed in toluene at a concentration of 50 mg/ml in order to form a stock solution of gold nanoparticles. In a second step, the conductive powder, in particular the carbon black, in particular with grains of from 40 nm to 60 nm in diameter, is used as is without additional preparation. The source of silicon, in particular diphenylsilane, is used as is without additional preparation. Subsequently, in a third step, 40 μL of stock solution of gold nanoparticles are mixed with 100 mg of carbon black and 370 μL of diphenylsilane in 20 mL of dry hexane at ambient atmosphere for 1 hour. The hexane is evaporated by using a rotary evaporator. The solid obtained is deposited in a reactor consisting of a Pyrex tube with an external diameter of 16 mm and a thickness of 1 mm. The reactor is then placed on a vacuum line and sealed with a blow torch at around 15 cm from the end. In a fourth step, the reactor is placed in a furnace at 450° C. for 1 h, then it is taken out of the furnace and left to cool for 30 minutes at ambient temperature. The reactor is broken under ambient conditions. The result of the heat treatment is that the carbon powder is covered with silicon nanowires (m=300 mg for the product obtained in step E3-1 from FIG. 1) and an organic matrix of polyphenylsilanes. This powder is then transferred from the Pyrex tube into a 40 mL plastic centrifuge tube with 10 mL of chloroform. An ultrasound bath is used to obtain a fine suspension of the composite. Lastly, 20 mL of ethanol is added to the suspension of the composite in the chloroform. The mixture is centrifuged for 5 minutes at 8000 rpm, the solvent is removed and replaced by 10 mL of toluene. 20 mL of ethanol are added to the suspension of the composite in the toluene. The mixture is centrifuged for 5 minutes at 8000 rpm, the solvent is removed in order to obtain, after drying under vacuum, a solid black product (m=135 mg for the product obtained in step E3-2 from FIG. 1), which is ready to use and corresponds to the product obtained described above.

A second example consists in synthesizing a batch of a composite of non-doped silicon nanowires and carbon black covered with a carbon coating. In a first step, gold nanoparticles are synthesized according to the process described in the article by Brust et al. mentioned above. Their diameter is from 1 nm to 4 nm, and their surface is covered with dodecanethiol. The nanoparticles are then dispersed in toluene at a concentration of 50 mg/ml in order to form a stock solution of gold nanoparticles. In a second step, the conductive powder, in particular the carbon black (for example with grains of from 40 nm to 60 nm in diameter), is used as is without additional preparation. The source of silicon, in particular diphenylsilane, is used as is without additional preparation. In a third step, 40 μL of stock solution of gold nanoparticles are mixed with 100 mg of carbon black and 370 μL of diphenylsilane in 20 mL of dry hexane at ambient atmosphere for 1 hour. The hexane is evaporated by using a rotary evaporator. The solid obtained is deposited in a reactor (Pyrex tube with an external diameter of 16 mm and a thickness of 1 mm). The reactor is then placed on a vacuum line and sealed with a blow torch at around 15 cm from the end. In a fourth step, the reactor is placed in a furnace at 450° C. for 1 h, then it is taken out of the furnace and left to cool for 30 minutes at ambient temperature. The reactor is broken under ambient conditions. In a fifth step, the opening of the reactor results in the recovery of a conductive powder covered with silicon nanowires (m=300 mg for the product obtained in step E3-1 from FIG. 2) and an organic matrix of polyphenylsilanes. This powder is transferred from the Pyrex tube into a reactor consisting of a quartz tube with an external diameter of 16 mm and a thickness of 1 mm. The reactor is then placed on a vacuum line and sealed with a blow torch at around 15 cm from the end. In a sixth step, the reactor is placed in a furnace at 900° C. for 1 h, then it is taken out of the furnace and left to cool for 1 hour at ambient temperature. The reactor is broken under ambient conditions in order to recover a solid black product (m=255 mg for the product obtained in step E3-2 from FIG. 2), which is ready to use and corresponds to the product obtained described above.

A third example consists in synthesizing a batch of a composite of phosphorus-doped silicon nanowires and carbon black for example with grains of from 40 nm to 60 nm in diameter. In a first step, gold nanoparticles are synthesized according to the process described in the article by Brust et al. Their diameter is from 1 to 4 nm, and their surface is covered with dodecanethiol. They are dispersed in toluene at a concentration of 50 mg/ml in order to form a stock solution of gold nanoparticles. In a second step, the conductive powder, in particular the carbon black, for example with grains of from 40 nm to 60 nm in diameter, is used as is without additional preparation. The source of silicon, in particular diphenylsilane, is used as is without additional preparation. The source of phosphorus (the dopant), in particular diphenylphosphine, is used as is without additional preparation. In a third step, 40 μL of stock solution of gold nanoparticles are mixed with 100 mg of carbon black, 3.5 μL of diphenylphosphine and 370 μL of diphenylsilane in 20 mL of dry hexane at ambient atmosphere for 1 hour. The hexane is evaporated by using a rotary evaporator. The solid obtained is deposited in a reactor (Pyrex tube with an external diameter of 16 mm and a thickness of 1 mm). The reactor is then placed on a vacuum line and sealed with a blow torch at around 15 cm from the end. In a fourth step, the reactor is placed in a furnace at 450° C. for 1 h, then it is taken out of the furnace and left to cool for 30 minutes at ambient temperature. The reactor is broken under ambient conditions. In a fifth step, the carbon support covered with silicon nanowires (m=260 mg), polyphenylphosphines and polyphenylsilanes is transferred from the Pyrex tube into a 40 mL plastic centrifuge tube with 10 mL of chloroform. An ultrasound bath is used to obtain a fine suspension of the composite.

Lastly, in a sixth step, 20 mL of ethanol is added to the suspension of the composite in the chloroform. The mixture is centrifuged for 5 minutes at 8000 rpm, the solvent is removed and replaced by 10 mL of toluene. 20 mL of ethanol are added to the suspension of the composite in the toluene. The mixture is centrifuged for 5 minutes at 8000 rpm, the solvent is removed in order to obtain, after drying under vacuum, a solid black product (m=115 mg), which is ready to use and corresponds to the product obtained described above.

The invention also relates to a process for manufacturing an electrode. Such an electrode manufacturing process comprises a step of forming said electrode from the product obtained from the process for manufacturing the product described above. This step of forming the electrode may:
    directly use the product comprising a plurality of electrically conductive grains, in which at least two nanoelements extend from each grain of the plurality of electrically conductive grains,
    use the product obtained according to the manufacturing process,
    implement the process for manufacturing the product according to what is described in the present description.

In particular, the product obtained is such that it is, according to one preferred embodiment, in the form of a powder comprising a plurality of electrically conductive grains to which nanoelements are attached. The nanoelements have a maximum lateral dimension (or diameter where appropriate) of from 1 nm to 100 nm with a standard deviation distribution of less than or equal to 50% and a length of from 100 nm to 50 μm. Moreover, the powder may comprise here all the structural features described in the present description in connection with the product obtained without it necessarily being obtained by the manufacturing process.

The invention also relates to an electrode for an energy storage element, said electrode comprising the powder described in the paragraph above. Within the context of the electrode, the grains 3 of the plurality of electrically conductive grains are joined together by a binder. The binders are well known from the prior art, mention may in particular be made of carboxymethylcellulose (CMC).

The product obtained may be used as active material in electrochemical accumulator electrodes, in particular in the anodes of lithium-ion batteries. It may be used as electrode material of a supercapacitor. It may be used as electrode for electrocatalysis, electroreduction of ions for water pollution control, the recovery of ions dissolved in liquid phases by reduction, the growth of biofilms in biofuel cells.

In this sense, the invention also relates to an energy storage element comprising an electrode, in particular an anode, formed by the electrode as described or an electrode obtained according to the electrode manufacturing process, in particular said storage element is a lithium-ion battery.

The very high specific surface area of the conductive interconnected network of nanowires provides the electrode, obtained according to the electrode manufacturing process, with a very high current density, both in batteries and in capacitors. The electrical interconnection is provided on the one hand by the contacts between the nanowires, but also by the contact between the nanowires and the grains of the plurality of grains on which they have grown. An easy control of the ratio between intercalating material and the grains of the plurality of electrically conductive grains allows the synthesis of composites with chosen energy densities. Typically, the intercalating material/grains of the plurality of electrically conductive grains weight ratio before growth is advantageous in the proportions 10/90 to 90/10.

It was mentioned above that the nanowires can be doped during their growth, or after their growth. In the case of silicon as intercalating material, the conductivity of said intercalating material, intrinsically low for pure silicon, may thus be increased to give the intercalating material metallic behavior and reduce the series resistances. In this way, the electrode obtained with the product gives rise to fewer voltage losses and less of a temperature rise.

The grains of the plurality of electrically conductive grains make it possible, on the one hand, to limit the diffusion of the catalyst during the growth of the nanowires (in this way, the catalyst nanoparticles remain small and the nanowires of intercalating material of the invention have a thin and uniform diameter) and, on the other hand, to improve the characteristics of the product obtained as a new anode material of lithium-ion batteries (the electrical conductivity of the product obtained prevents the aggregation of the nanowires of intercalating material and maintains the porosity in order to absorb the change in volume of the intercalating material during the cycling).

The very high specific surface area, combined with a doping of the nanowires suitable for ensuring a high conductivity of the network and a surface treatment suitable for ensuring a high long-term chemical stability of the network, makes it possible to obtain supercapacitors, micro-supercapacitors or ultra-micro-supercapacitors with a high energy density.

Furthermore, the very thin and uniform diameter of the nanowires ensures a high mechanical stability of the electrode during lithiation/delithiation cycles in lithium batteries, and makes it possible to obtain lithium batteries that are more durable than the prior art. Specifically, preferentially, the nanowires of intercalating material have both a diameter that is thin, that is to say less than 100 nm, and uniform over all of the nanowires, that is to say having less than 50% standard deviation in the distribution of the diameters, and a long length, of from 100 nm to 50 microns. This quality gives the product obtained a very high specific surface area, the active surface area of the electrode manufactured from the product obtained is therefore higher for a same volume or a same mass than another type of electrode, which increases the current density of the electrical energy storage element incorporating said electrode. The conductive coating offers enough structured space to absorb the change in volume of the nanowires of intercalating material during the cycling.

The present invention proposes a large-scale one-pot synthesis method that enables in particular the production of a product consisting of silicon nanowires that are very uniform in diameter, grafted to a conductive matrix, in particular of carbon (for example nanoparticles or microparticles of carbon black or graphite), using low-cost and environmentally-friendly reactants and processes. The method is very versatile and makes it possible to adjust the characteristics of the product:

The weight proportions between the silicon and the matrix may be easily adjusted by changing the proportions of precursors.

The diameter of the silicon nanowires may be easily controlled by changing the size of the growth catalysts.

The electrical conductivity of the silicon nanowires may be adjusted by in situ doping.

The silicon nanowires may be covered with a thin protective layer, in particular with a layer of carbon.

This new product may be used as anode material of a lithium-ion battery, or as electrode material of a supercapacitor.

The invention claimed is:

1. A process for manufacturing a product comprising nanoelements, the process comprising:
forming a mixture comprising a plurality of electrically conductive grains, a catalyst separate from the grains of the plurality of electrically conductive grains, and a reactant that is liquid or in the form of a suspension of solid particles in a liquid solvent and comprises a precursor of the material intended to form the nanoelements,
introducing the mixture into a chamber of a reactor and pressurizing the reactor to a pressure less than 1 bar,
obtaining the product from the mixture, wherein the obtaining comprises growing the nanoelements from the catalyst, then combined with the grains of the plurality of electrically conductive grains, the growing being carried out by applying a heat treatment to the mixture.

2. The process as claimed in claim 1, wherein the application of the heat treatment to the mixture is carried out at a temperature in a range of from 270° C. to 600° C., under a non-oxidizing atmosphere.

3. The process as claimed in claim 2, wherein the application of the heat treatment to the mixture is carried out at a temperature in a range of from 270° C. to 450° C., under a non-oxidizing atmosphere.

4. The process as claimed in claim 1, comprising, prior to forming the mixture, supplying the plurality of electrically conductive grains combined with the catalyst that is intended for the growth of the nanoelements.

5. The process as claimed in claim 4, wherein the supplying of the plurality of electrically conductive grains is performed so that the catalyst comprises a plurality of catalyst elements, and at least one grain of the plurality of electrically conductive grains comprises a surface to which at least one of the catalyst elements of the plurality of catalyst elements is attached.

6. The process as claimed in claim 5, wherein 50% of the grains of the plurality of grains are adorned with at least one catalyst element.

7. The process as claimed in claim 4, comprising producing the plurality of electrically conductive grains combined with the catalyst by a process comprising:
   placing the grains of the plurality of grains and the catalyst in a solvent,
   drying, which makes it possible to evaporate the solvent which results in the combination of the catalyst with the grains of the plurality of electrically conductive grains.

8. The process as claimed in claim 1, wherein the obtaining of the product comprises forming an intermediate product comprising electrically conductive grains, from which the nanoelements extend, and a matrix at least partly covering the electrically conductive grains and the nanoelements.

9. The process as claimed in claim 8, wherein the obtaining of the product comprises removing the matrix from the intermediate product carried out by washing the intermediate product.

10. The process as claimed in claim 9, wherein the obtaining of the product comprises, after removing the matrix, depositing an electrically conductive layer on the nanoelements or performing electrical doping of the nanoelements.

11. The process as claimed in claim 8, wherein the obtaining of the product comprises heating the intermediate product so as to enable the formation, from the matrix, of an electrically conductive coating on the nanoelements.

12. The process as claimed in claim 11, wherein the heating of the intermediate product is carried out by performing an additional heat treatment of the intermediate product at a temperature in a range of from 600° C. to 1500° C.

13. The process as claimed in claim 11, wherein the obtaining of the product (1) is performed so that, at the end of the obtaining, the product obtained is in the form of a powder provided with electrically conductive grains from which the nanoelements extend.

14. The process as claimed in claim 12, wherein the heating of the intermediate product is carried out by performing an additional heat treatment of the intermediate product at a temperature in a range of from 900° C. to 1000° C.

15. The process as claimed in claim 1, wherein the material intended to form the nanoelements is chosen so that the material comprises at least one selected from the group consisting of silicon, germanium an alloy of silicon with at least one material selected from the group consisting of germanium, tin, nickel, copper and other transition metals, and an alloy of germanium with at least one material selected from silicon, tin, nickel, copper and other transition metals.

16. The process as claimed in claim 1, wherein the obtaining of the product comprises functionalizing the nanoelements comprising depositing a functional layer on the nanoelements.

17. A process for manufacturing an electrode, comprising forming the electrode from the product obtained from the process as claimed in claim 1.

* * * * *